(12) United States Patent
Fairbanks

(10) Patent No.: US 7,701,253 B2
(45) Date of Patent: Apr. 20, 2010

(54) BOOSTER CIRCUITS FOR REDUCING LATENCY

(75) Inventor: Scott M. Fairbanks, Mountain View, CA (US)

(73) Assignee: Oracle America, Inc., Redwood Shores, CA (US)

( * ) Notice: Subject to any disclaimer, the term of this patent is extended or adjusted under 35 U.S.C. 154(b) by 0 days.

(21) Appl. No.: 12/507,857

(22) Filed: Jul. 23, 2009

(65) Prior Publication Data
US 2009/0273362 A1 Nov. 5, 2009

Related U.S. Application Data

(62) Division of application No. 11/694,729, filed on Mar. 30, 2007, now abandoned.

(51) Int. Cl.
*H03K 19/094* (2006.01)
(52) U.S. Cl. .......................... 326/83; 326/87
(58) Field of Classification Search .................. 326/34, 326/83, 87
See application file for complete search history.

(56) References Cited

U.S. PATENT DOCUMENTS 4,816,705 A * 3/1989 Ohba et al. ................. 326/110

OTHER PUBLICATIONS

Author Unknown, "Optimal ratio f for a chain of inverters", www.ece.Rochester.edu/courses/ECE261/hw2.pdf, 6 pages, at least as early as Mar. 30, 2007.

Ebergen et al., "Transistor Sizing: How to Control the Speed and Energy Consumption of a Circuit", Proceedings of the 10th International Symposium on Asynchronous Circuits and Systems, IEEE, pp. 51-61, Apr. 19-23, 2004.

Ebergen et al., "Transistor Sizing: How to Control the Speed and Energy Consumption of a Circuit", www.ics.forth.gr/async2004/presentations/sizing_speed_energy.pdf, Async Design Group, Sun Labs, Sun Microsystems, Inc. 31 pages, at least as early as Mar. 30, 2007.

\* cited by examiner

*Primary Examiner*—James H. Cho
*Assistant Examiner*—Thienvu V Tran
(74) *Attorney, Agent, or Firm*—Dorsey & Whitney LLP

(57) ABSTRACT

A booster circuit for reducing the nominal latency of a logic gate. The booster circuit includes a charge sharing mechanism to transfer a stored charge to the output of the logic gate in response to a logic state transition on the input of the logic gate. The transfer of stored charge also reduces the charge drawn from the supply during the output transition.

12 Claims, 11 Drawing Sheets

FIG. 1 (BACKGROUND)

US 7,701,253 B2

BOOSTER CIRCUITS FOR REDUCING LATENCY

CROSS-REFERENCE TO RELATED APPLICATION

This application is a divisional patent application of U.S. patent application Ser. No. 11/694,729, filed Mar. 30, 2007 and entitled "Booster Circuits for Reducing Latency;" the disclosure of which is hereby incorporated herein in its entirety.

FIELD OF THE INVENTION

Aspects of the present invention relate to circuit techniques for improving latency and power consumption of digital circuits. One particular aspect of the present invention relates to booster circuits that operate in parallel with other digital circuits to decrease latency and reduce power consumption.

BACKGROUND

Digital circuits may contain millions of devices on a single integrated circuit. The devices are generally very small to increase speed, reduce energy consumption and reduce the total area of an integrated circuit. Sometimes, an internally generated signal has to drive a very large external load as quickly as possible, such as when an internal signal has to drive an input/output pad of the integrated circuit. The internal signal is generally provided by a very small device that cannot drive a large load without incurring substantial delays due to the limited drive current available for charging/discharging the capacitive load.

The best performance in terms of minimum delay when an internal signal has to drive a large load may generally be achieved by using a chain of inverters, where each inverter is proportioned to the preceding inverter by an amount equal to the ratio of the final load divided by the input load ($C_L/C_{in}$), otherwise commonly known as the electrical step-up, and this ratio is taken to the root power of the number of stages used in the chain. The number of stages in the chain is generally chosen such that this result is greater than e (about 2.7) but less than $e^2$ (about 7.3).

In some circuits, such as a pipeline stage of a processor, use of optimally sized inverters may not be sufficient to meet timing constraints. This may be true when the pipeline stage is having trouble meeting timing constraints. Generally, latency is the time delay from when an input of a device changes state to when the output of the device changes state. Latency is generally measured from the 50% point of the input signal transition which caused the output to change, to the 50% point of output signal transition. Thus, what is needed is a circuit that boosts performance of logic gates with respect to latency and also reduces power consumed by the logic gates and/or area consumed by the logic gates.

SUMMARY

One aspect of the present invention involves a booster circuit for decreasing latency of a logic gate. The circuit includes an input node to receive a logic state transition, a switch element that changes state in response to the logic state transition and a node that has a stored charge. The node is configured to transfer the stored charge through the switch element to the output node in response to the logic state transition. The transfer of stored charge is used to reduce the nominal latency of the logic gate.

Another aspect of the present invention involves a method for reducing latency of a logic gate. The method involves coupling a booster circuit with a charge sharing mechanism from the input of the logic gate to the output of the logic gate. The method further involves receiving a logic state transition on the input node and transferring a charge from the charge sharing mechanism to the output node in response to the logic state transition. Finally, the method involves decreasing the latency of the logic gate through the charge shared.

DETAILED DESCRIPTION OF EMBODIMENTS OF THE INVENTION

Figure 1:
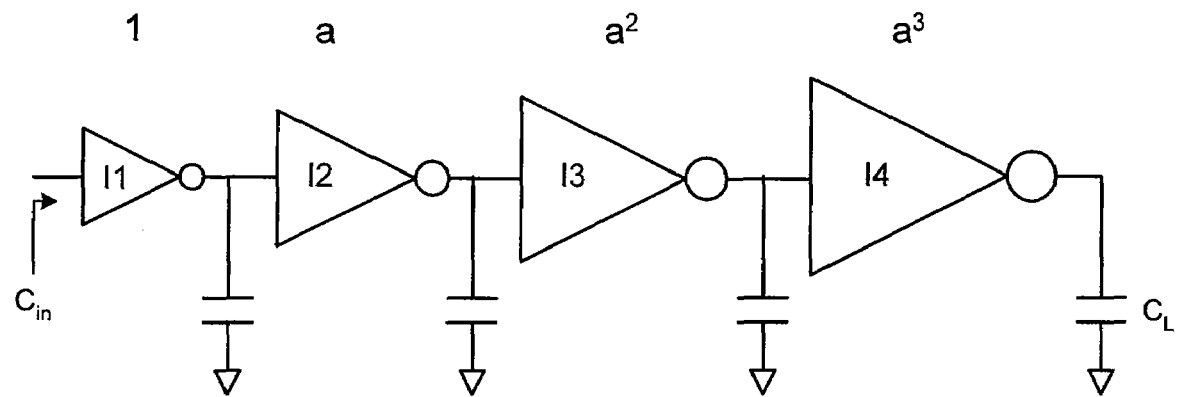
FIG. 1 depicts a technique for minimizing overall delay of a string of inverters.

One aspect of the present invention involves circuits for reducing latency on a logic path while simultaneously saving power when compared to conventional implementations such as depicted in FIG. 1. One embodiment of the present invention utilizes a family of logic circuits that digitally evaluates a logic expression (boost circuitry), but which may be unable to drive its output to the full logic level. These circuits may be operated in parallel or alongside conventional logic gates or state holding elements that evaluate the same logic expression to reduce latency and power consumption.

The boost circuitry generally exploits the voltage potential on nodes in successive stages of the circuitry where one node is an output, the node potentials are opposite of each other, and the nodes want to take on the potential of the other node when a transition on the output node occurs. By effectively tying the two nodes together, each node may be quickly driven toward the other by sharing charge and without initially requiring significant charge drawn from the supply. Conventional logic gates operating in parallel with the boost circuitry may complete the transition by driving the output node to its full digital value. Thus, boost circuitry conforming to aspects of the present invention, may be used in combination with digital circuits to reduce latency and power consumption.

Figure 2:
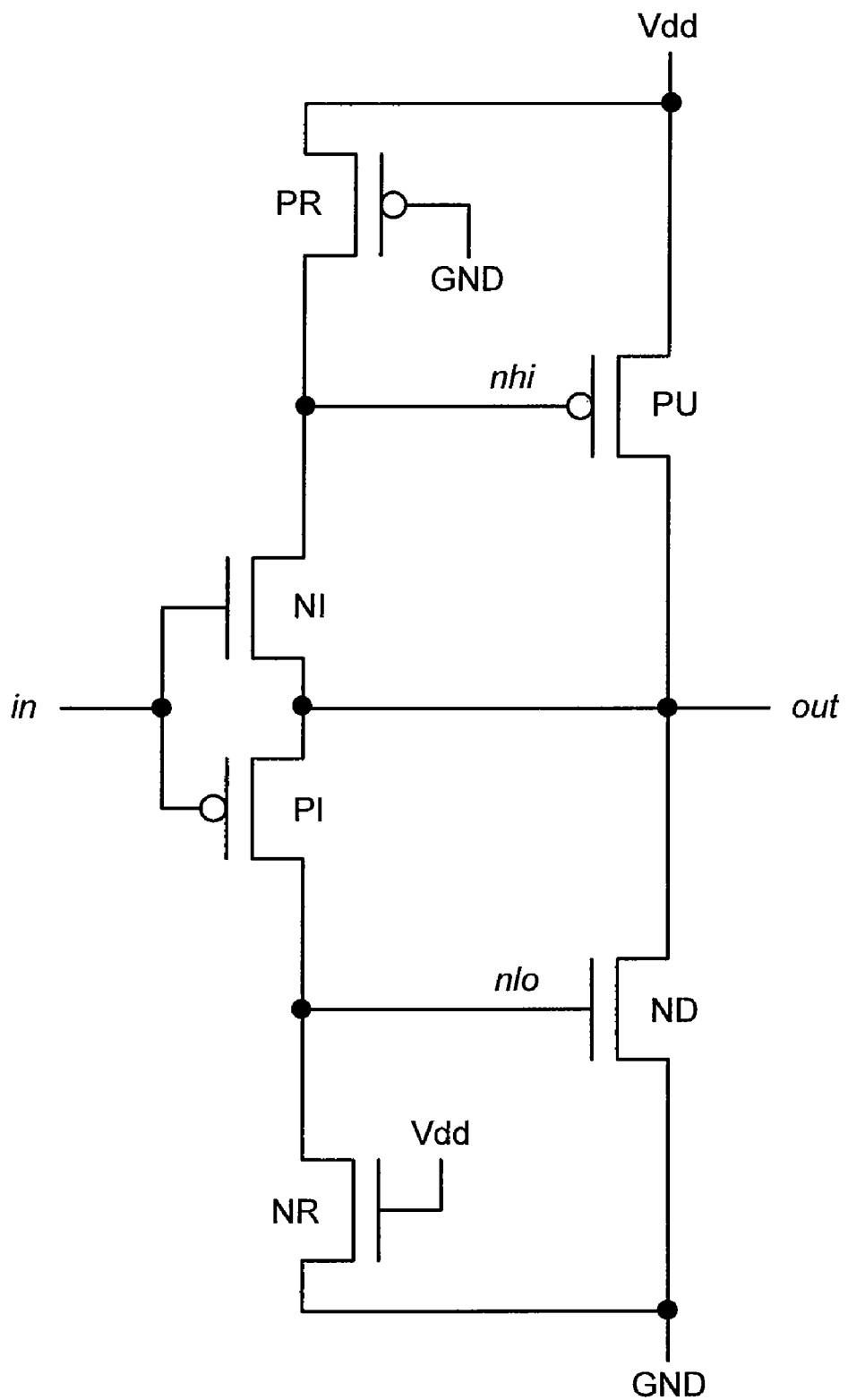
FIG. 2 depicts a full booster amplifier circuit of one embodiment of the present invention.

FIG. 2 depicts a full amplifier booster circuit. The booster circuit may be decomposed into a pull-up booster and a pull-down booster. P-channel transistor PR, n-channel transistor NI and p-channel transistor PU may operate as a pull-up booster circuit. N-channel transistor NR, p-channel transistor PI and n-channel transistor ND may operate as a pull-down booster. The circuit causes an output transition in response to an input transition to occur with less latency by helping the output reach the 50% point sooner. The circuit also helps the output transition more efficiently by recycling charge stored on internal nodes. These internal nodes and the output node switch logic states opposite to one another. Establishing a low resistance path between the internal node to the output node during part of the logic transition helps both the internal node and the output node transition in the desired direction (from the current logic state to the opposite logic state). Further, in particular implementations set forth herein, the transition occurs without initially pulling charge from the supply or sourcing charge to ground.

When the input node in is low the output node out is low. When in transitions high (a logic one), the pull-up booster becomes active. Transistor NI becomes transparent (conducting) creating a low resistance path between the output node out to node nhi. This has at least two beneficial effects. First, the output node moves toward a logic one from a logic zero, its desired direction, without pulling any charge from the supply, $V_{dd}$. Rather, the charge needed to transition the output toward a logic one is initially supplied by the charge stored on node nhi (due to the capacitance, $C_{nhi}$, of the devices connected to node nhi). That is, the output node has a certain capacitance, $C_{out}$, which initially is at a logic zero voltage potential. This capacitance has to be charged when the output transitions to a logic one. When the output node out is tied to node nhi, these two capacitors act as a voltage divider and the output node quickly reaches a voltage potential which can be expressed mathematically as:

$V_{qs}=V_{nhi}*C_{nhi}/(C_{out}+C_{nhi})$; where $V_{nhi}$ is the voltage potential on node nhi when the input is at a logic zero.

Thus, the voltage potential of the output node out is moved in the right direction without drawing any power from the supply which helps reduce power consumption.

Second, the node nhi moves toward a logic zero from a logic one, its desired direction, without sinking any charge to ground, GND, which also helps reduce power consumption. As node nhi moves toward a logic zero, transistor PU begins to conduct charge from $V_{dd}$ to the output node out. PU continues to charge the output node, and its own gate through transistor NI, until node nhi reaches a threshold voltage below $V_{dd}$ and PU ceases conducting. Accordingly, the initial charge to transition the output node out to a logic one is provided by the charge stored at node nhi, while the remaining charge to complete the pull-up of the output node is provided by $V_{dd}$ through transistor PU.

When in transitions from a logic zero to a logic one, the output of the second stage of the booster begins to move quickly after a single gate delay (due to transistor NI). The output node potential quickly moves to the potential $V_{qs}$, which is determined by charge sharing when the output node is tied to node nhi as discussed above. The drive transistor PU moves the output node potential between $V_{qs}$ and $V_{thr}=V_{dd}-V_{pthr}$, where $V_{pthr}$ is the gate to source voltage of transistor PU that causes it to start conducting. The rate at which the output node moves between these two potentials decreases exponentially as it approaches $V_{thr}$.

The pull-down booster operates when the output node out moves in the opposite direction, from a logic one toward a logic zero. When the input node in is high the output node out is high. When in transitions from a logic one to a logic zero, PI becomes transparent (conducting) creating a low resistance path between the output node out to node nlo. This also has two beneficial effects. First, the output node out moves from a logic one towards a logic zero, its desired direction, without sinking any charge to GND. Second, the node nlo moves from a logic zero toward a logic one, its desired direction, without pulling any charge from $V_{dd}$. When node nlo moves toward a logic one, transistor ND begins to conduct charge from the output node to GND. Transistor ND continues to discharge the output node, and its own gate through PI, until node nlo reaches a threshold voltage above GND and transistor ND ceases conducting.

When in transitions from a logic one to a logic zero, the output of the second stage of the booster begins to move quickly after a single gate delay (due to transistor PI). The output potential quickly moves to the potential $V_{qs}$, which is determined by charge sharing when the output node is tied to node nlo. The drive transistor ND moves the output node potential between $V_{qs}$ and $V_{thr}=GND+V_{nthr}$, where $V_{nthr}$ is the gate to source voltage of transistor ND that causes it to start conducting. The rate at which the output node moves between these two potentials decreases exponentially as it approaches $V_{thr}$.

Generally, the latency of the booster circuit is improved by making the drive transistors PU and ND large enough such that $V_{qs}$ exceeds the threshold voltage of the following stage. Because the potential $V_{qs}$ is reached quickly, the next stage turns on sooner. This reduces latency by starting the signal moving along earlier.

Figure 3:
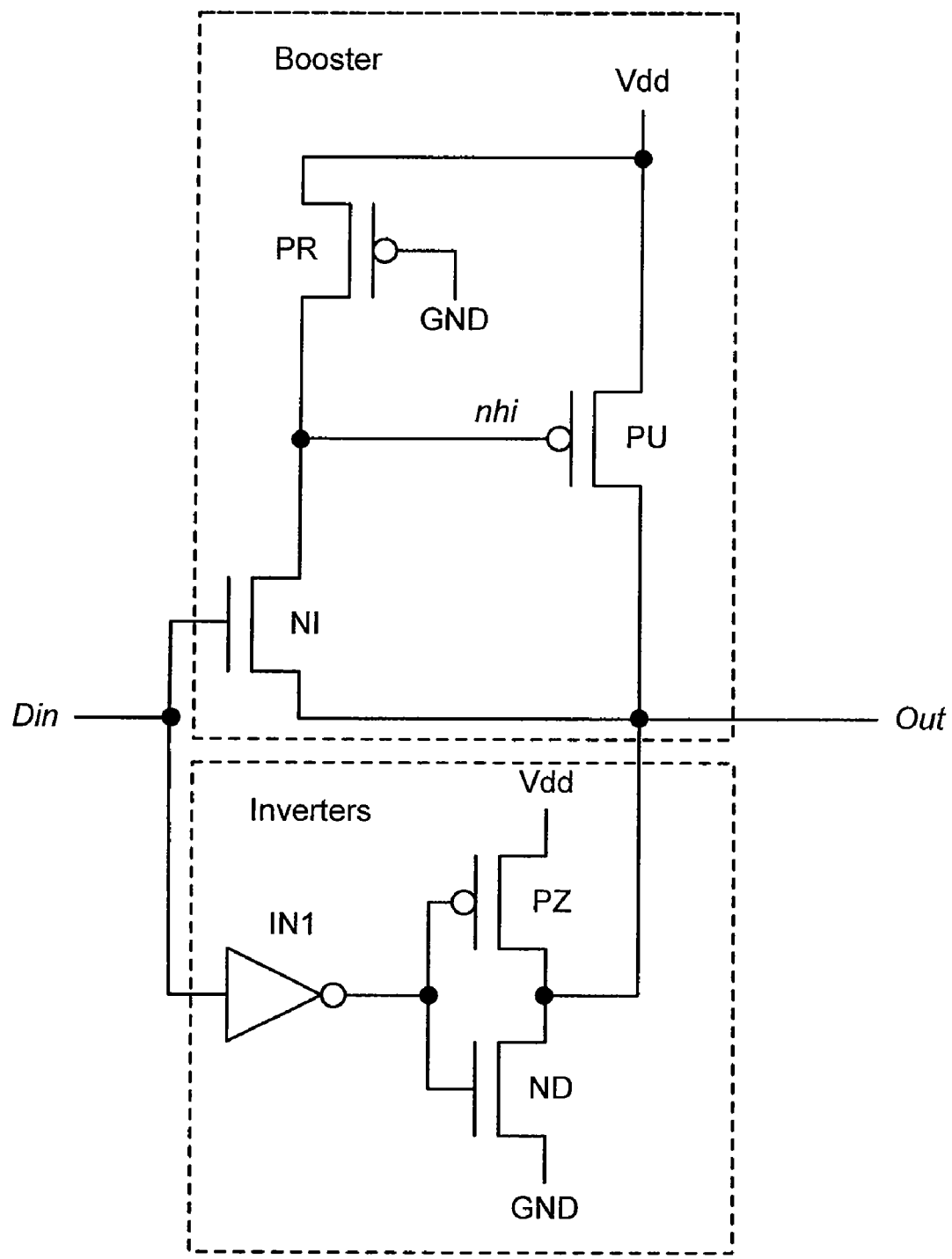
FIG. 3 depicts a pull-up booster circuit operating in parallel with two series inverters.

The full booster circuit depicted in FIG. 2 generally cannot function on its own because it does not drive the output node to full digital logic levels. Other circuitry is generally required to restore the output node to full digital logic levels. For example, one embodiment of the present invention may use a keeper circuit (back-to-back inverters) at the output to restore the output voltage to the full rail voltages ($V_{dd}$ and GND) during switching. Another embodiment of the present invention may use two series inverters operating in parallel with the booster circuit (FIG. 3 discussed below). As previously discussed, a substantial portion of the charge used to change the output node potential is provided by the booster amplifier. The charge needed to move the output from $V_{qs}$ to the supply may be provided by the second of the series inverters that is operating in parallel with the booster circuit. As will be explained below, the booster circuit and the two series inverters may operate more efficiently and with less latency than either the booster circuit or the two series inverters acting alone.

FIG. 3 depicts a pull-up booster circuit operating in parallel with two series inverters, IN1 and transistors PZ and ND. When the input node transitions from a logic one to a logic zero, the two series inverters function normally and the pull-up booster circuit does not contribute to the transition. The pull-up booster circuit however may contribute a small amount of loading on the input node.

When the input node (Din) transitions from a logic zero to a logic one, after a single gate delay (the time for transistor NI to turn on), transistor NI becomes transparent, creating a low resistance path between the output node Out and node nhi. Transistor ND remains conducting (because it is conducting when the input is at a logic zero and has not yet turned off) and further drives the gate of transistor PU down beyond $V_{qs}$. By the time transistor PZ begins to drive the output to a logic one, the pull-up drive transistor PU has been pulling the output node to a logic one for a whole gate delay. As the potential on the output node moves higher beyond $V_{thr}$, the drive transistor PU turns off and transistor PZ finishes driving the output node Out to a logic one.

To determine the performance of the driver circuit depicted in FIG. 3, its performance was compared with conventional driver circuits that were optimally sized. The conventional driver circuits used two series inverters, three series inverters and four series inverters. For each driver configuration, a string of optimally sized drivers was used to drive similar loads. The first inverter was generally about the minimum size as explained in more detail below. Further, the input capacitance of each driver was about the same to provide similar step-ups. The input capacitance of each input device may generally be estimated by its gate capacitance, $C_g$, which may be mathematically represented as:

$C_g = C_{permicron} * W = (\epsilon_{ox}/t_{ox}) * L * W$; where L is the minimum gate length for the fabrication process, W is the width of the gate, $t_{ox}$ is the thickness of the gate oxide and $\epsilon_{ox}$ is the permittivity of the gate oxide.

Thus, the input capacitance may be specified using gate width when the minimum length of the transistors remain constant.

The minimum size of a standard CMOS inverter is generally determined by the minimum length, L, and width, W, of a transistor gate (process dependent). Generally, the p-channel transistor gate is about two to three times the width of the n-channel transistor gate to provide about the same drive current for charging and discharging load capacitance to equalize rise and fall times. The p-channel transistor generally needs to be about two to three times the size of the n-channel transistor because the electrons used to conduct charge in n-channel devices are two to three times more mobile, or conductive, than holes which are used to conduct charge in p-channel devices.

Figure 4A:
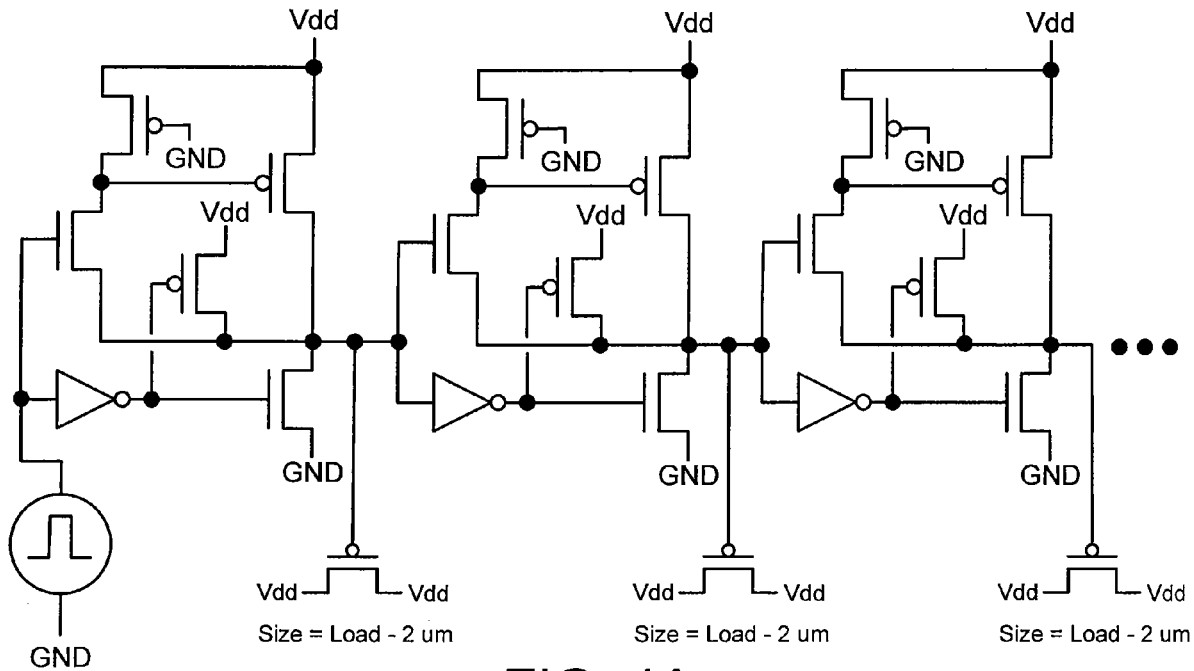
FIG. 4 depicts a test setup for three driver configurations modeled in Hspice; a driver string having two series inverters and booster circuit per driver, a driver string having two series inverters per driver and a driver string having three series inverters per driver.
Figure 4B:
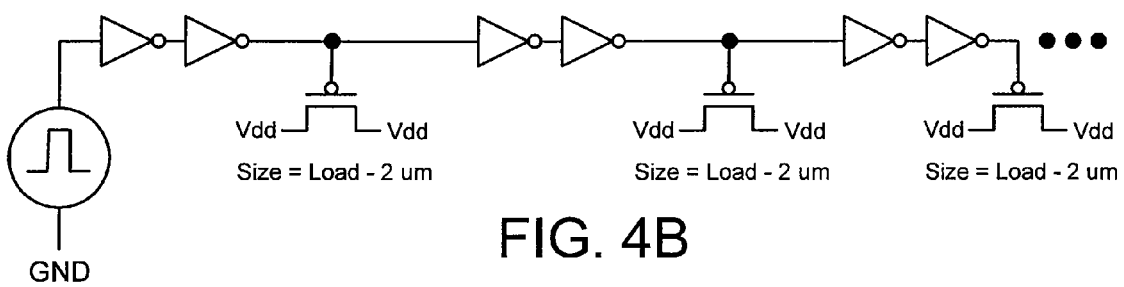

For the string of drivers using two series inverters, as depicted in FIG. 4B, in each driver the two series inverters were optimally sized to drive the load given an initial driver size with an input capacitance of 2 um. For the driver using a booster, as depicted in FIG. 4A, the transistors PU and ND (see FIG. 3) were sized to have the same amount of transistor width as the optimally sized second inverter of the two series inverters replaced. That is, for the driver using the booster circuit, the sum of the transistor width used in IN1 and NI equaled 2 um. PU and ND were matched to be the same size and p and n device in the second of the two series inverters. The booster circuit has extra transistor width equal to the sum of the widths of transistors PZ and PR. The size of the second inverter may be represented mathematically as:

Size=$Size_{stage}1$*SQRT (electrical gain); where electrical gain is the capacitance of the load divided by the input capacitance of the first stage driver. For example, if the load is a size 10 inverter and the first stage is a size 1 inverter, then the electrical gain is 10. This may be driven by two stages with the first stage being of size 1 and the second stage being of size SQRT(10) which is about 3.1.

Further, the total transistor width (which determines input capacitance) contributed by transistors IN1 and NI was about the same size as the size of the first inverter in the two series inverters being replaced. About three-fourths of this capacitance is contributed by inverter IN1 and about one-fourth is contributed by transistor NI. Transistor PZ was sized to be about a fourth the size of transistor PU. Note that for minimum length devices, the sizing may be specified in terms of input capacitance, transistor width or drive strength which are equivalent.

Figure 4C:
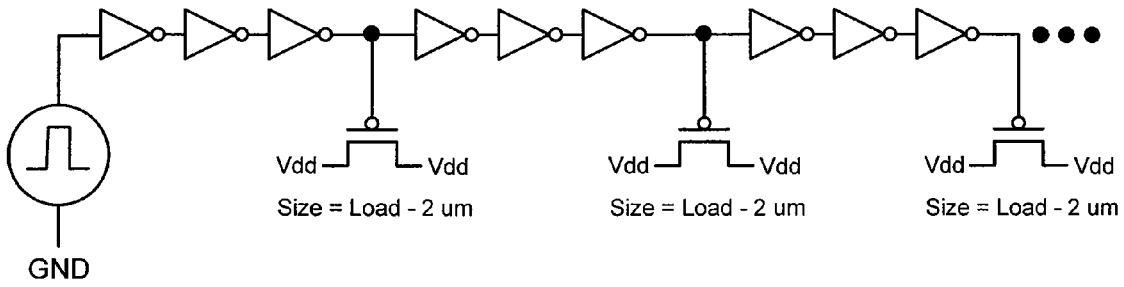

The merit of the properly sized circuit depicted in FIG. 3 was determined by modeling the circuit in Hspice, a commercially available circuit simulation program. The conventional driver circuits were also modeled using Hspice. FIG. 4 depicts the test setup for three driver circuits modeled in Hspice. FIG. 4A depicts a string of three drivers, each having two series inverters with a pull-up booster, FIG. 4B depicts a second string of three drivers, each having two series inverters and FIG. 4C depicts a third string of three drivers, each having three series inverters. A fourth string of three drivers (not shown in FIG. 4), each having four series inverters, was also simulated.

As depicted in FIG. 4, each driver in the string drives a load. This load is generally composed of the input capacitance of the next driver stage and a gate of a transistor sized so that the total load of the driver results in a desired step-up. In FIGS. 4B and 4C, each of the drivers is optimally sized for the given output load. For a total step-up of TS (defined as the output load capacitance, $C_L$, divided by the input capacitance, $C_{in}$, of the inverter in the first driver stage), each driver in the chain has a step-up of about $TS^{1/N}$, where N is the number of drivers in the chain. The drivers of FIG. 4A, which utilize boosters, were sized as described above. As previously indicated, each driver chain was designed to have about the same input capacitance and drives about the same output load capacitance. Thus, each driver chain has a similar step-up.

For example, if the size of the load is 18 um of transistor and the input of the first stage is 2 um, the total step-up or electrical gain or G=load/input=(18 um+2 um)/2 um or 10. For FIG. 4B the first stage was sized to be 2 um and the second stage sized to be 2 um*10^(½)=2 um*3.16=7.32 um. For FIG. 4C the first stage was sized to be 2 um and the second stage to be of size 2 um*10^(⅓)=2 um*2.15=4.3 um. It should be noted that 2 um*10^(⅔)=20 um=output load. For FIG. 4D the first stage size was 2 um, the second stage to be of size=2 um*10^(¼)=2 um*1.77=3.54 um, the third stage to be of size=2 um*10^(2/4)=2 um*3.16=7.32 um, and the fourth stage to be of size=2 um*10^(¾)=2 um*5.62=11.24. Again note that 2 um*10^(4/4)=2 um*10=20 um=output load.

While FIG. 4 depicts circuits having a series of three drivers in each chain, the simulation modeled the circuits as having a series of eight drivers in each chain. The simulation measured the latency between the fifth and sixth drivers of each chain.

Figure 5:
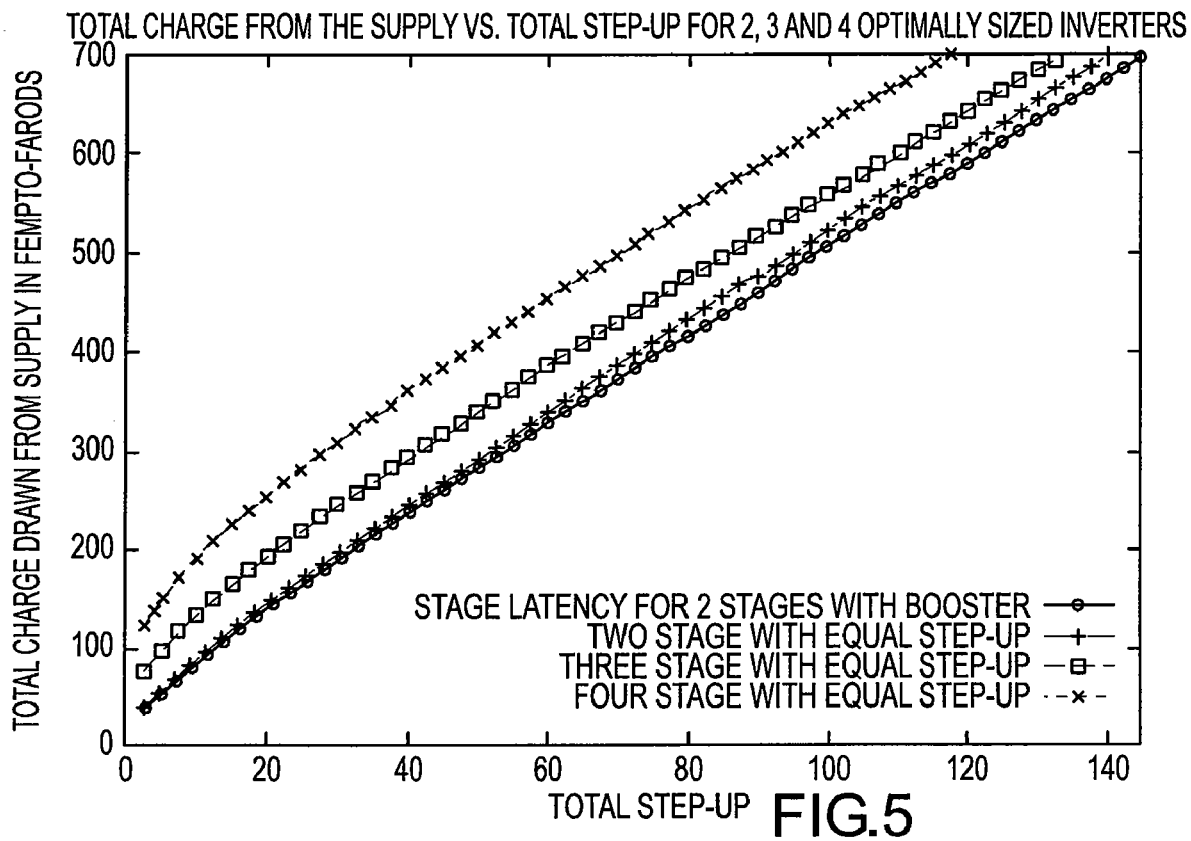
FIG. 5 depicts the total charge used by each driver depicted in FIG. 4 as a function of total step-up.
Figure 6:
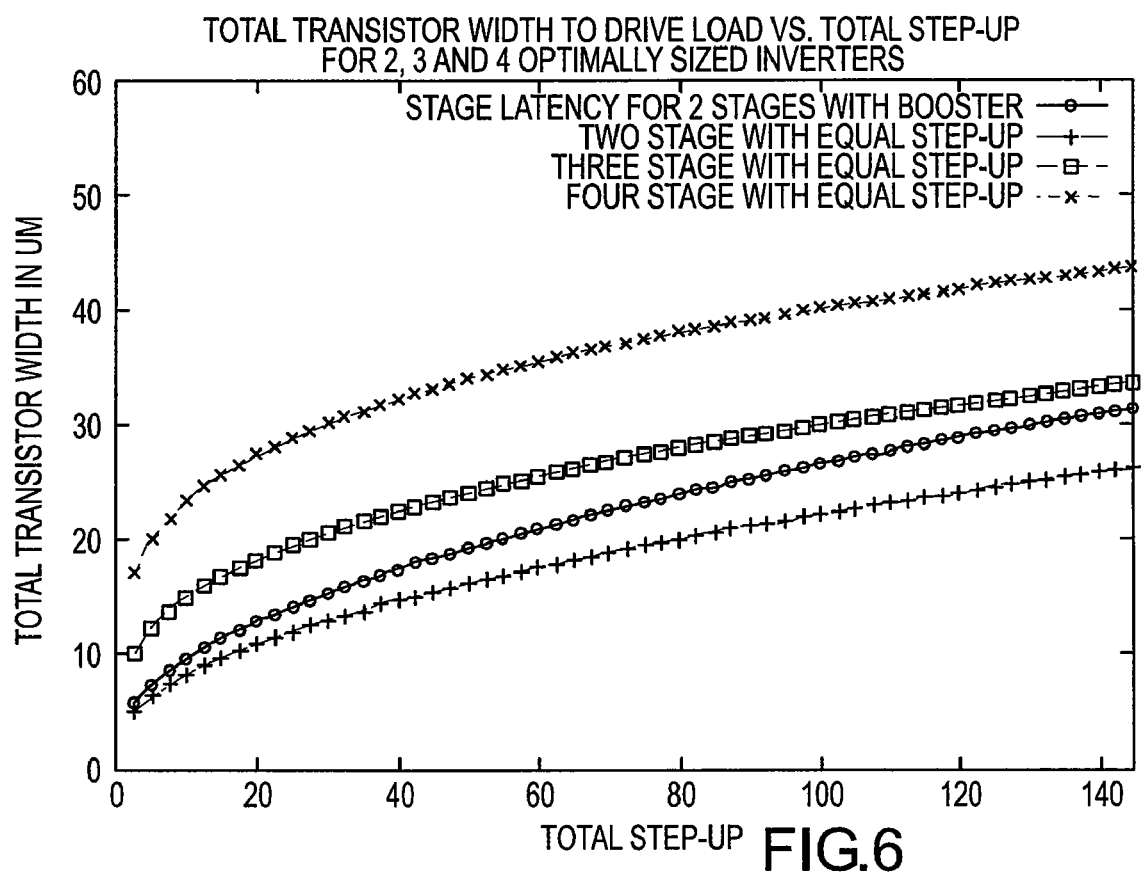
FIG. 6 depicts the total transistor width for each driver of FIG. 4 as a function of total step-up.
Figure 7:
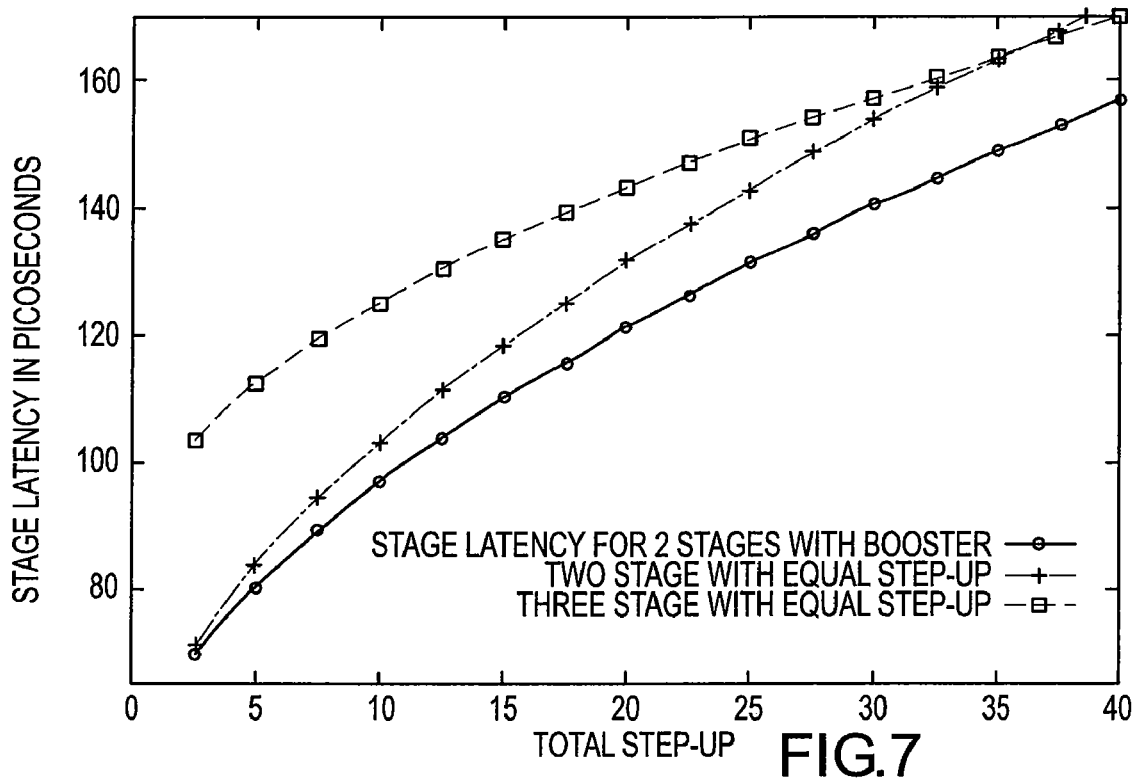
FIG. 7 depicts the latency in picoseconds of the driver circuits of FIG. 4 as a function of total step-up.

The results of the Hspice simulation are depicted graphically in FIGS. 5 through 8 for a total step-up ranging from 1 to 140. At each step-up, the load capacitance driven by each driver chain was adjusted to achieve the desired total step-up. Recall that the total step-up of a chain of inverters is the ratio of load capacitance to the input capacitance of the first inverter. The input capacitance of the first inverter in each driver chain was fixed at 2 um. Thus, the load capacitance at each step-up is 2 um*step-up (e.g., for a step-up of 50, the load capacitance on the final driver is 100 um). For each output load, the latency between stages was measured and the amount of charge drawn from the supply was integrated over a complete cycle. FIG. 5 indicates that for the sizes chosen in the booster circuit, the booster circuit drives the output with less power consumption. FIG. 7 shows that even though the booster circuit draws less power, it drives the output with less latency for step-ups less than about 80.

FIG. 5 depicts the total charge drawn from the supply in fempto-farads for each driver of FIG. 4 for one cycle versus electrical gain (step-up). As FIG. 5 shows, for the sizes chosen for the booster circuit, the booster circuit drives the output with less power consumption (less loading on the supply) than any of the other driver configurations.

In addition to lower and latency, the area consumed on a chip might be a concern. FIG. 6 depicts the total transistor width of the drivers of FIG. 4 as a function of step-up. At each step-up, the transistor width of each driver was sized to optimally drive the output load As FIG. 6 depicts, the booster circuit contributes extra transistor width over the two stage driver but uses less transistor width that the three and four stage drivers. That is, the area overhead for the booster circuit is usually insignificantly more that the two inverter driver design and is less than the three and four inverter driver designs.

Figure 8:
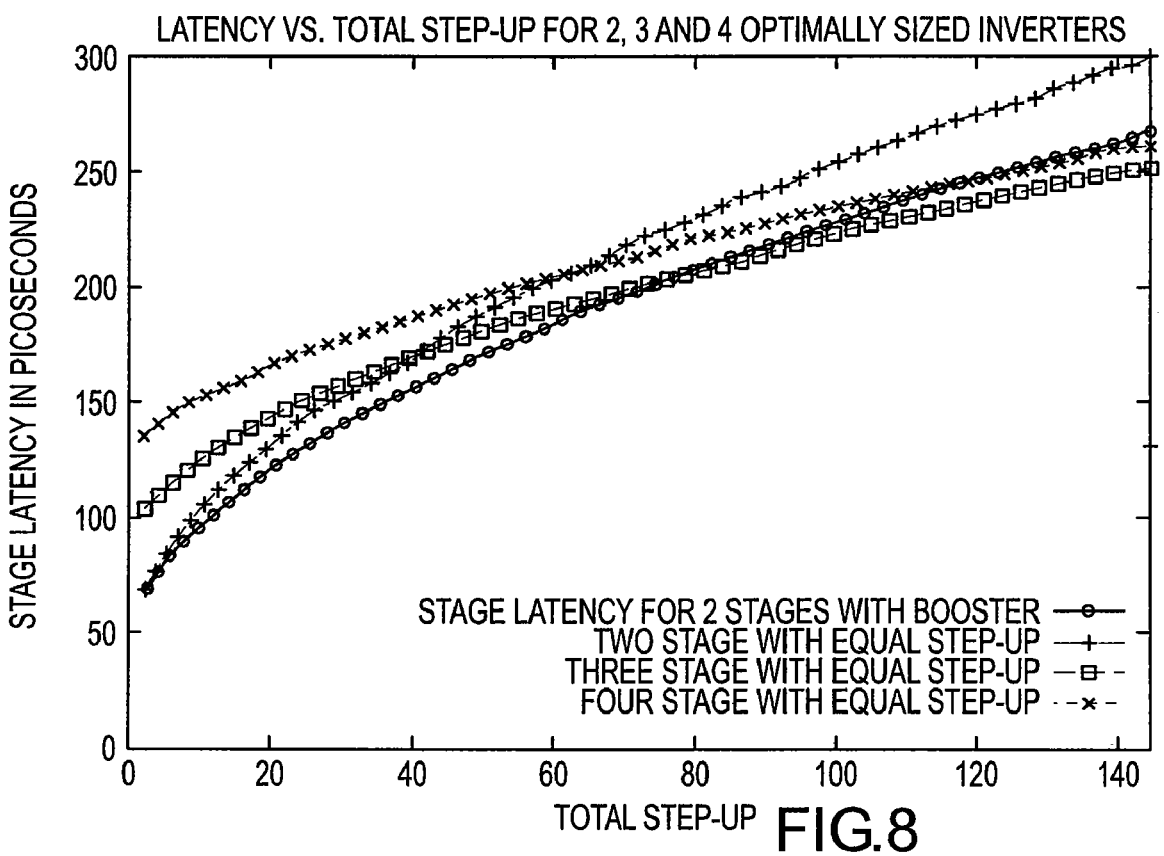
FIG. 8 depicts the latency of the driver circuits of FIG. 4 over a broader range of total step-up.

FIG. 7 depicts the stage latency in picoseconds (vertical axis) of the driver circuits of FIG. 4 as a function of total step-up (horizontal axis). FIG. 8 depicts the latency of the drivers in picoseconds (vertical axis) over a broader range of total step-up (horizontal axis). As FIGS. 7 and 8 show, the two series inverter driver incurs less delay than the three and four series inverter drivers for step-ups less than about 35. The three inverter driver incurs less delay than a four inverter driver for step-ups less than about 160. The two series inverter driver with booster incurs less delay than two series inverters alone for all step-ups (the latency is about 10% less). The driver with booster also incurs less delay than three series inverters for step-ups less than about 78 while using about 20% less power and about 15% less transistor width. The boosted driver also incurs less delay than the four series inverters for step-ups less than about 125 while using about 35% less power and transistor width.

Figure 9:
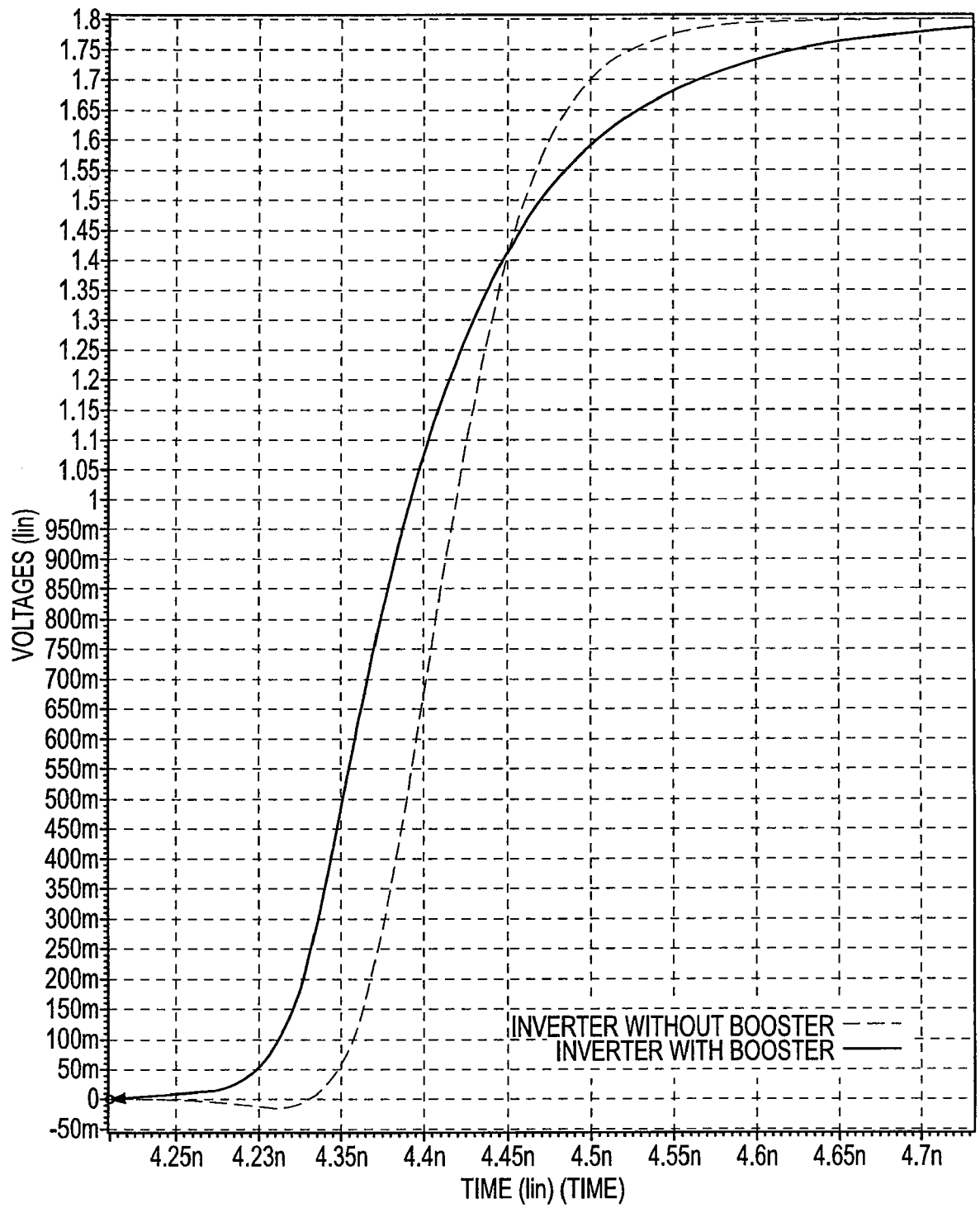
FIG. 9 depicts the logic switching behavior of an inverter circuit with a booster versus a standard inverter without a booster.

FIG. 9 depicts the switching characteristics of an inverter with a booster circuit as compared to the switching characteristics of a normal inverter. Each inverter is driven by the same input signal and each inverter drives about the same output load. The output of the inverter with a booster reaches the 50% point (half the supply) faster than a normal inverter, but then tapers off after reaching about 950 mV relative to a normal inverter. As FIG. 9 illustrates, the booster may be used to decrease latency along a logic path by decreasing the switching time of the logic to reach the 50% point at the expense of tending to skew the output signal (how long the output takes to reach the final value). Thus, the booster circuit generally will not be able to pass frequencies as high as non-boosted inverters. This may be an acceptable tradeoff for circuits that may be having difficulty meeting timing constraints but not pushing circuit bandwidth. An example application of where such a booster may be beneficial is a trap handler. Such signals occur infrequently making circuit bandwidth less important than being able to raise the trap handler flag as quickly as possible. Another application for booster circuits may be in a processor pipeline stage that may be having difficulty meeting timing constraints.

Figure 10:
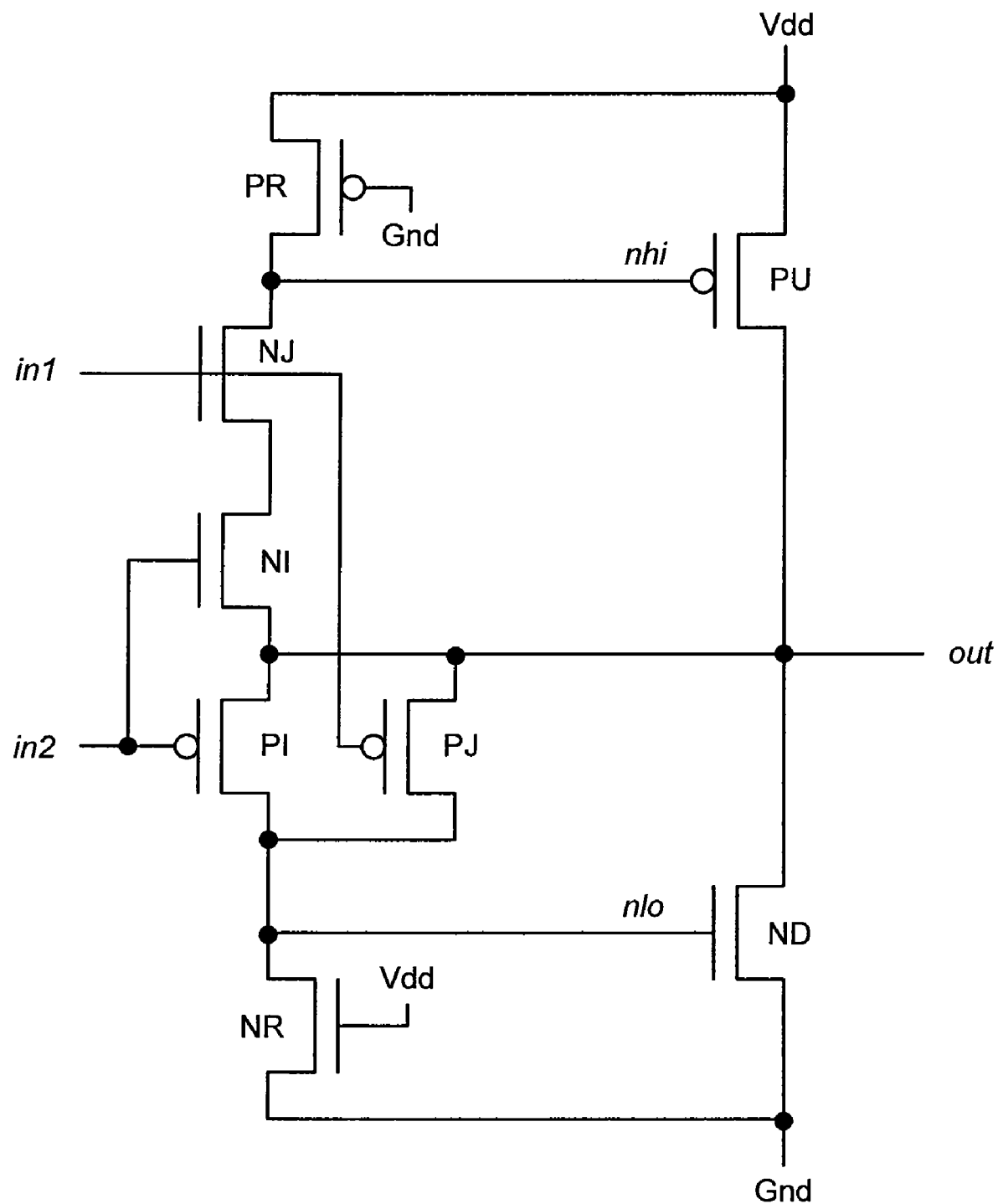
FIG. 10 depicts a full booster circuit for the pull-up and pull-down portion of a two-input AND function.

The booster circuit may also be used to boost the performance of gates that implement logic functions. Depicted in FIG. 10 is a full-booster circuit for the pull-up and pull-down portion of a two-input AND function used by an embodiment of the present invention. Transistors PU, PR and NI act as a pull-up booster circuit for the AND function. Transistors ND, NR and PI act as a pull-down booster circuit for the AND function. Transistors NJ, NI, PI and PJ perform the logic expression evaluation of the AND function for the booster circuit. Recall that the booster circuit also evaluates the same logic expression as the logic gate to which it is connected. Note that the booster circuit of FIG. 10 would be connected to a two-input AND gate such that the in1 and in2 terminals are connected to input 1 and input 2 of the AND gate and the out terminal is connected to the output of the AND gate.

The principles of operation the booster circuit shown in FIG. 10 are similar to the simple booster circuit described above. When both inputs become a logic one, a low resistance path is established between the output out and the gate of the transistor PU, node nhi. Charge sharing occurs, bringing node nhi lower and causing transistor PU to conduct. Meanwhile, the output node out is initially pulled up due to charge sharing, and then pulled up to $V_{dd}$-$V_{nthr}$ through the series NMOS transistors NJ and NI. The rest of the pull-up to a logic one is provided by the AND gate to which the booster is attached. A complementary action occurs during pull-down except that when either in1 or in2 is at a logic zero, a low resistance path between the node nlo and the output node out is established.

Figure 11:
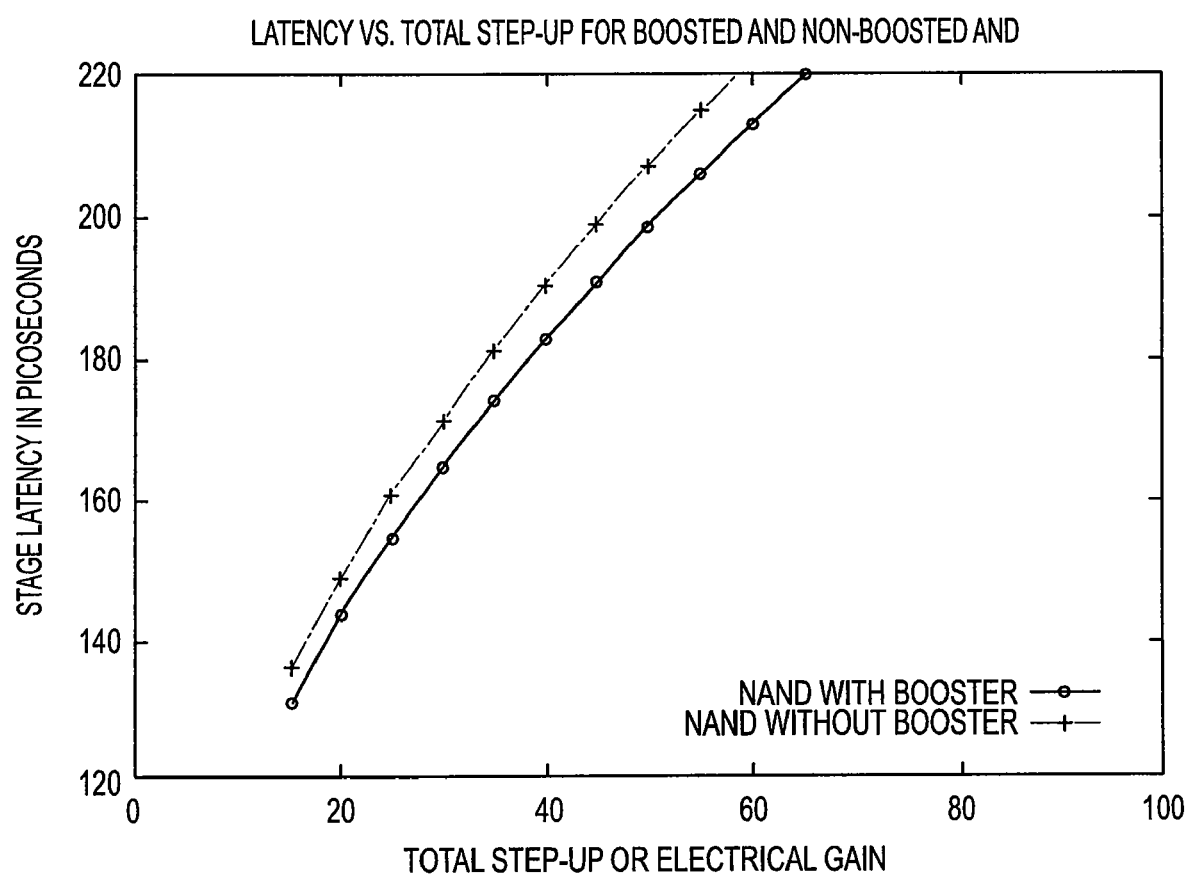
FIG. 11 depicts the latency of the boosted AND function of FIG. 10 as a function of total step-up.

FIG. 11 depicts the latency versus step-up for the boosted AND circuit of FIG. 9 and a non-boosted AND circuit. The latencies average rising and falling transitions for three cases: when a first input is changing and the second input is fixed at a logic one, when a second input changing and the first input is fixed at a logic one, and when both inputs change simultaneously from a logic zero to a logic one.

Figure 12:
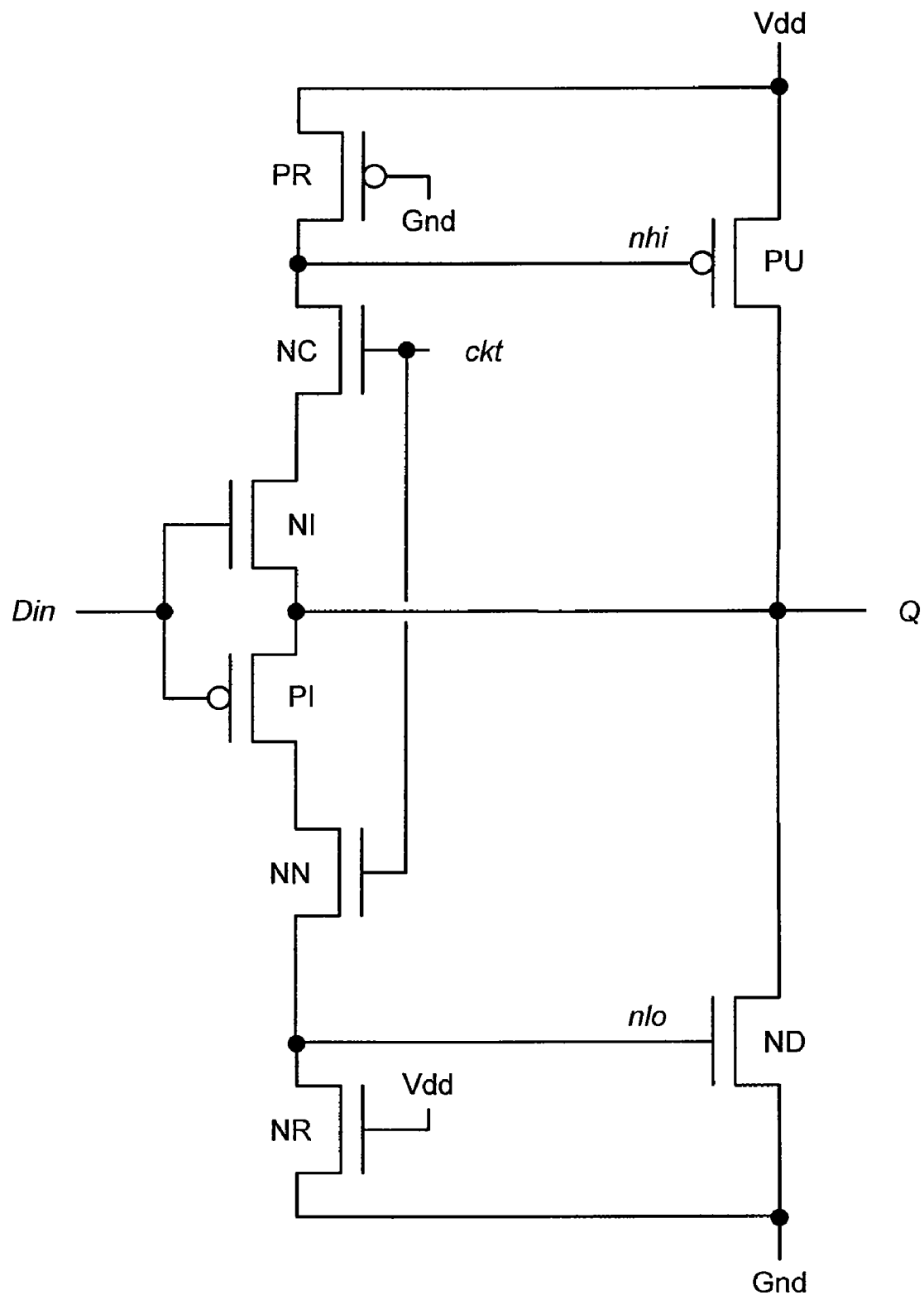
FIG. 12 depicts a circuit diagram of a full booster latch.

FIG. 12 depicts an embodiment of the present invention for a full latch booster. The full latch booster includes transistors PU, PR and NI acting as a pull-up booster and transistors ND, NR and PI acting as a pull-down booster.

Figure 13:
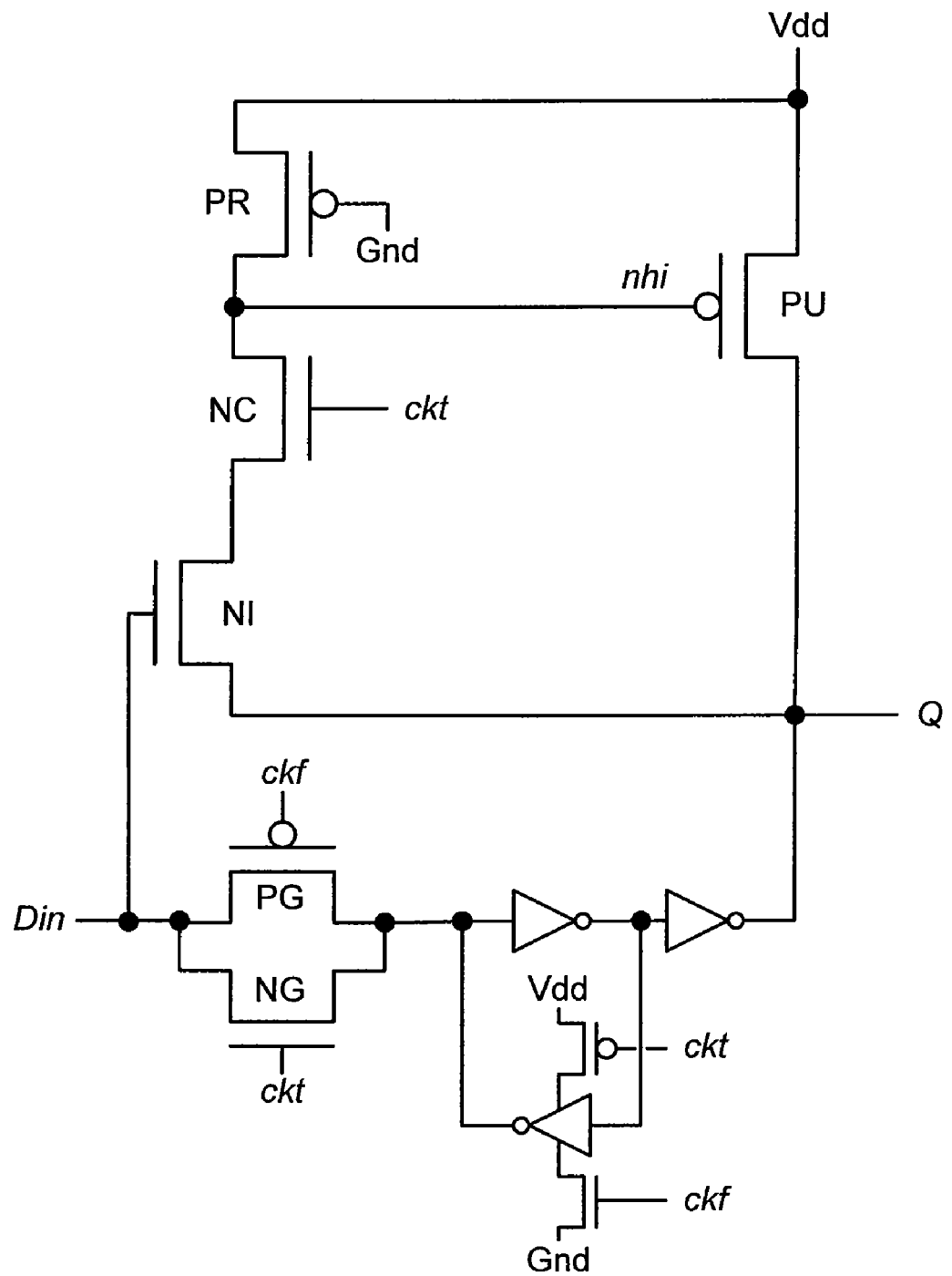
FIG. 13 depicts a circuit diagram of a simple latch with a pull-up booster connected in parallel.

FIG. 13 depicts a simple latch booster having only a pull-up booster. Transistors PU, PR and NI form the pull-up operation. The rest of the booster circuitry shown performs the evaluation function for a latch. As previously indicated, the latch booster would be connected to a standard latch such that the booster terminals Din, Q, ckt and ckf are connected to the corresponding terminals of the latch.

The output, Q, of a latch copies the value at the input, Din, of the latch when the clock, ckt, is a logic one. The latch booster reduces the rising edge Din-Q delay and clk-Q delay. When the output Q changes to a logic one, it gets a boost. After a single gate delay after the second of either Din or ckt transitions to a logic one, a low resistance path is formed between the output Q and node nhi. This starts output node Q rising and node nhi lowering, the direction both nodes wish to go, through charge sharing. Then transistor PU begins conducting charge into output node Q. When node Q rises to within a threshold voltage of $V_{dd}$, PU ceases conducting and the traditional latch circuit takes over to finish driving Q to a full logic one.

It should be noted that there are many variables that contribute to the performance of a booster circuit for a given step-up. The performance of logic gates with booster circuits may vary depending on which input of the logic gate switches last and how much delay occurs between the inputs being switched. Thus, particular logic gates and/or logic families may perform better with full booster circuits, pull-up boosters only or pull-down boosters only.

Embodiments of the present invention may utilize full booster circuits in parallel with logic gates to improve the latency of the logic gates while decreasing power consumption. Other embodiments may only employ pull-up boosters or pull-down boosters to improve logic gate performance. While the invention has been described using CMOS logic circuits, this is by way of illustration only, and is not meant to be limiting.

What is claimed is:

1. A circuit for decreasing latency of a logic gate having an input, an output and a nominal latency, the circuit comprising:
   a pull-up booster circuit that assists the logic gate in a logic zero to a logic one transition on the output comprising:

an input node configured to receive a logic state transition;
a first switch element configured to chance to a conductive state in response to the logic state transition;
a first node having a stored charge arranged to transfer the stored charge to an output node through the first switch element in response to the logic state transition, the transfer of stored charge decreasing the nominal latency of the logic gate;
a second switch element coupled to the first node and configured to precharge the first node prior to the logic state transition;
a third switch element coupled to the first node and configured to provide an additional charge to the output node during the logic state transition; and
the logic gate electrically coupled in parallel with the pull-up booster circuit, wherein the logic gate comprises one of the following logic gates:
a plurality of serially coupled inverters;
an AND gate; or
a latch.

2. The circuit of claim 1 wherein the pull-up booster circuit reduces dynamic power consumption of the logic gate.

3. The circuit of claim 1 wherein the first node switches logic states opposite of the output node.

4. The circuit of claim 1 wherein the first node comprises a capacitive load charged to a first voltage potential to provide the stored charge.

5. The circuit of claim 1 wherein the nominal latency is measured at a 50% logic state transition point.

6. The circuit of claim 1 further comprising a pull-down booster circuit, the pull-up and pull down-booster circuits each comprising first and second switches, and wherein the AND gate comprises:
a two-input AND gate comprising:
an input switch coupled in between the first and second switches of the pull-up booster, the input switch receiving a first input; and
an output switch coupled to the first and second switches of the pull-down booster and the output node, the output switch receiving the first input.

7. A circuit for decreasing latency of a logic gate having an input, an output and a nominal latency, the circuit comprising:
a pull-down booster circuit that assists the logic gate in a logic one to a logic zero transition on the output comprising:
an input node configured to receive a logic state transition;
a first switch element configured to chance to a conductive state in response to the logic state transition;
a first node having a stored charge arranged to transfer the stored charge to an output node through the first switch element in response to the logic state transition, the transfer of stored charge decreasing the nominal latency of the logic gate;
a second switch element coupled to the first node and configured to precharge the first node prior to the logic state transition;
a third switch element coupled to the first node and configured to provide an additional charge to the output node during the logic state transition; and
the logic gate electrically coupled in parallel with the pull-down booster circuit, wherein the logic gate comprises one of the following logic gates:
a plurality of serially coupled inverters;
an AND gate; or
a latch.

8. The circuit of claim 7 wherein the pull-down booster circuit reduces dynamic power consumption of the logic gate.

9. A circuit for decreasing latency of a logic gate having an input, an output and a nominal latency, the circuit comprising:
a booster circuit comprising:
an input node configured to receive a logic state transition;
a first switch element configured to change to a conductive state in response to the logic state transition, wherein the first switch element comprises a first n-channel transistor having a third source terminal coupled to the output, a third gate terminal coupled to the input, and a third drain terminal coupled to the first gate terminal;
a first node having a stored charge arranged to transfer the stored charge to an output node through the first switch element in response to the logic state transition, the transfer of stored charge decreasing the nominal latency of the logic gate;
a second switch element coupled to the first node and configured to precharge the first node prior to the logic state transition, wherein the second switch element comprises a second p-channel transistor having a second gate terminal coupled to a second supply voltage, a second source terminal coupled to the first supply voltage, and a second drain terminal coupled to the first gate terminal;
a third switch element coupled to the first node and configured to provide an additional charge to the output node during the logic state transition, wherein the third switch element comprises a first p-channel transistor having a first source terminal coupled to a first supply voltage, a first drain terminal coupled to the output, and a first gate terminal; and
the logic gate electrically coupled in parallel with the booster circuit, wherein the logic gate comprises a CMOS logic gate.

10. A circuit for decreasing latency of a logic gate having an input, an output and a nominal latency, the circuit comprising:
a booster circuit comprising:
an input node configured to receive a logic state transition;
a first switch element configured to change to a conductive state in response to the logic state transition, wherein the first switch element comprises a first p-channel transistor having a third source terminal coupled to the output node, a third gate terminal coupled to the input node, and a third drain terminal coupled to the first gate terminal;
a first node having a stored charge arranged to transfer the stored charge to an output node through the first switch element in response to the logic state transition, the transfer of stored charge decreasing the nominal latency of the logic gate;
a second switch element coupled to the first node and configured to precharge the first node prior to the logic state transition, wherein the second switch element comprises a second n-channel transistor having a second gate terminal coupled to a second supply voltage, a second source terminal coupled to the first supply voltage, and a second drain terminal coupled to the first gate terminal;
a third switch element coupled to the first node and configured to provide an additional charge to the output node during the logic state transition wherein the third switch element comprises a first n-channel transistor having a first source terminal coupled to a first supply voltage, a first drain terminal coupled to the output node, and a first gate terminal; and the logic gate electrically coupled in parallel with the booster circuit, wherein the logic gate comprises a CMOS logic gate.

11. A circuit for decreasing latency of a logic gate having an input, an output and a nominal latency, the circuit comprising:

a booster circuit comprising:

an input node configured to receive a logic state transition;

a first switch element configured to change to a conductive state in response to the logic state transition;

a first node having a stored charge arranged to transfer the stored charge to an output node through the first switch element in response to the logic state transition, the transfer of stored charge decreasing the nominal latency of the logic gate;

a second switch element coupled to the first node and configured to precharge the first node prior to the logic state transition;

a third switch element coupled to the first node and configured to provide an additional charge to the output node during the logic state transition; and the logic gate electrically coupled in parallel with the booster circuit, wherein the logic gate comprises a plurality of inverters comprising:

a first inverter having an input coupled to the input node; and a second inverter serially coupled to the first inverter having an output coupled to the output node.

12. A circuit for decreasing latency of a logic gate having an input, an output and a nominal latency, the circuit comprising:

a booster circuit comprising:

an input node configured to receive a logic state transition;

a first switch element configured to change to a conductive state in response to the logic state transition;

a first node having a stored charge arranged to transfer the stored charge to an output node through the first switch element in response to the logic state transition, the transfer of stored charge decreasing the nominal latency of the logic gate;

a second switch element coupled to the first node and configured to precharge the first node prior to the logic state transition;

a third switch element coupled to the first node and configured to provide an additional charge to the output node during the logic state transition; and the logic gate electrically coupled in parallel with the booster circuit, wherein the logic gate comprises a latch comprising a fourth switch coupled in between the first and second switches.

* * * * *

UNITED STATES PATENT AND TRADEMARK OFFICE
CERTIFICATE OF CORRECTION

PATENT NO. : 7,701,253 B2  
APPLICATION NO. : 12/507857  
DATED : April 20, 2010  
INVENTOR(S) : Scott M. Fairbanks et al.

It is certified that error appears in the above-identified patent and that said Letters Patent is hereby corrected as shown below:

In column 5, line 54, delete "Size=Size$_{stage}$1" and insert -- Size=Size$_{stage1}$ --, therefor.

In column 9, line 3, in claim 1, delete "chance" and insert -- change --, therefor.

In column 9, line 32, in claim 6, delete "pull down-booster" and insert -- pull-down booster --, therefor.

In column 9, line 49, in claim 7, delete "chance" and insert -- change --, therefor.

Signed and Sealed this  
Twelfth Day of April, 2011

David J. Kappos  
*Director of the United States Patent and Trademark Office*